United States Patent [19]

Huang

[11] Patent Number: 5,529,941

[45] Date of Patent: Jun. 25, 1996

[54] METHOD FOR MAKING AN INTEGRATED CIRCUIT STRUCTURE

[75] Inventor: Tiao-Yuan Huang, Cupertino, Calif.

[73] Assignee: VLSI Technology, Inc., San Jose, Calif.

[21] Appl. No.: 219,582

[22] Filed: Mar. 28, 1994

[51] Int. Cl.$^6$ .............................................. H01L 21/8234
[52] U.S. Cl. .................. 437/44; 437/34; 437/56
[58] Field of Search ................ 437/44, 34, 56, 437/57, 58, 59, 913

[56] References Cited

U.S. PATENT DOCUMENTS

| | | | |
|---|---|---|---|
| 4,528,744 | 7/1985 | Shibata | 437/34 |
| 4,891,326 | 1/1990 | Koyanagi | 437/57 |
| 5,023,190 | 6/1991 | Lee et al. | 437/44 |
| 5,175,120 | 12/1992 | Lee | 437/56 |
| 5,246,872 | 9/1993 | Mortensen | 437/44 |

OTHER PUBLICATIONS

Y. Wei et al., "Mosfet Drain Engineering for ESD Performance," Department of Electrical Engineering & Computer Science, University of California, Berkeley; EOS/ESD Symposium, 1992 pp. 143–148.

"Use of Sacrificial Spacers for Fabricating LDD Transistors in a CMOS Process," Electronics Letters, Apr. 10, 1986, vol. 22, No. 8, pp. 430–431.

Louis C. Parrillo et al., "An Advanced 0.5µ CMOS Disposable LDD Spacer Technology," 1989 Symposium on VLSI Technology, Digest of Technical Papers, Advanced Products Research Development Laboratory, pp. 31–32.

*Primary Examiner*—Brian E. Hearn
*Assistant Examiner*—Michael Trinh

[57] ABSTRACT

A method for making an integrated circuit in accordance with the present invention comprises fabricating at least one functional MOSFET with a hot electron resistant structure including a lightly doped drain, fabricating at least one output MOSFET with an ESD resistant structure including a gate means without associated spacers, and electrically coupling at least one functional MOSFET to at least one output MOSFET. An integrated circuit structure in accordance with the present invention includes at least one functional MOSFET having a hot electron resistant structure including a LDD drain, at least one output MOSFET having an ESD resistant structure including a gate means without associated spacers, and means for electrically coupling the two together. The functional MOSFET includes a gate insulator, a conductive gate region over the gate insulator, spacers along the sidewalls of the gate insulator and conductive gate regions, a pair of LDD regions, and source/drain regions. The output MOSFET includes a gate insulator, a conductive gate region over the gate insulator, and source/drain regions. A further method for making an integrated circuit structure includes the step of creating a plurality of NMOS and PMOS gate structures including at least one NMOS gate structure for an ESD transistor. The method further includes making a PMOS LDD implant, making an NMOS LDD implant, creating spacers on the NMOS and PMOS gate structures, removing the spacers from the NMOS gate structure(s) for an ESD transistor, and making source/drain implants for the NMOS and PMOS gate structures.

22 Claims, 4 Drawing Sheets

5,529,941

METHOD FOR MAKING AN INTEGRATED CIRCUIT STRUCTURE

BACKGROUND OF THE INVENTION

This invention relates generally to integrated circuits and, more particularly, to integrated circuit MOSFET devices and methods for their manufacture.

Metal oxide semiconductor field effect transistors (MOS-FETs) are basic electronic devices commonly used in many integrated circuits (ICs). A typical structure of an n-channel MOSFET is shown in FIG. 1a. A gate structure 10 is formed over a semiconductor substrate 12, and a source 14 and drain 16 region are formed on opposite sides of the gate structure 10 in the semiconductor substrate. The gate structure 10 typically comprises a gate oxide layer 18 and a polysilicon gate layer 20. When a sufficiently high electrical potential is applied to the polysilicon portion gate structure, a shallow conducting region or "channel" C is formed between the source and drain, which permits a current to flow, as indicated by the arrow 21 in FIG. 1a.

The size of individual devices or integrated circuits has decreased over time to permit higher density circuit integration. This decrease in feature size is reflected by a reduction in channel length, i.e., the length of the channel C between the source and the drain of a MOSFET device. A problem known as "hot carrier" or "hot electron" effect arises in devices with channel lengths of 1.2 micron ($\mu$) or less. A high electric (E) field develops within the channel and accelerates the carriers (electrons ($e^-$) for n-channel MOSFETs), some of which may imbed into the gate oxide layer, as illustrated in FIG. 1a. The "hot electron", trapped in the gate oxide layer, can cause an accumulation of charge, which can degrade the transconductance of the device and increase the threshold voltage.

A particular combination of opposing polarity type MOS-FETs (i.e. an n-channel and a p-channel MOSFET) in a single device forms a complementary metal oxide semiconductor (CMOS) device. CMOS devices are commonly used due to their very low standby power requirements, which makes them suitable in applications that require low energy consumption. Furthermore, CMOS devices tend to generate less heat than other technologies, so that they are well-suited for high-density circuitry.

FIG. 1b illustrates a standard circuit diagram of a CMOS invertor 23 formed by a p-channel MOSFET (PMOS) 22 and n-channel MOSFET (NMOS) 24. The PMOS transistor 22 acts to pull up the voltage at the output 26 when a low voltage is applied at the input 28. Conversely, the NMOS transistor 24 acts to pull down the output 26 when a high voltage is applied at the input 28.

The CMOS invertor 23 can be damaged by an electrostatic discharge (ESD) event occurring on its output 26. An ESD can occur, for example, when a person who has accumulated a static charge touches the IC of which CMOS invertor 23 is a part.

The degradation due to an ESD event is illustrated in the I-V characteristic curve 30 of FIG. 1c. As shown, a snapback 31 occurs when the ESD voltage exceeds the normal operating voltage, $V_n$, with permanent damage to an NMOS transistor 24 occurring at point 32 when the device enters second-breakdown. The pull-down transistor 24 of CMOS invertor 23 must therefore be able to withstand an ESD event to ensure a properly functioning circuit.

The production of PMOS and NMOS transistors requires balancing protection against the hot carrier effect and ESD events, since these protections tend to work against each other. Prior art MOSFET structures for combating the hot carrier effect in PMOS and NMOS transistors are illustrated in FIGS. 2a and 2b, respectively. As shown, a PMOS 34 has lightly doped drain (LDD) regions 36, and NMOS 38 has LDD regions 40. These LDD regions reduce the hot carrier effect, as is well known to those skilled in the art.

A variety of processes can be used to produce these structures, but typically, a low-density ion implant of the LDD regions is performed prior to the addition of insulating spacers S along the gate structure sidewalls. After the formation of the spacers, separate higher-density implants are performed for each type of MOSFET to form the source regions, 42 and 44, and drain regions, 46 and 48. An annealing process is then performed to activate the implanted ions. With the provision of the LDD regions, the E field proximate the channel is reduced and therefore the hot carrier effect is decreased, especially in NMOS transistors, which are more susceptible to the hot electron effect. However, the use of LDD NMOS transistors in the output buffer of a device degrades the ESD "hardness", i.e., resistance to static discharge, of the circuit.

A cross-sectional view of an NMOS ESD transistor structure 50 that is formed to combat both problems is shown in FIGS. 2c and 2d. The structure 50 is formed similarly to that described above with the forming of the spacers and implanting of the source and drain regions. However, following the source and drain implants, a heavy-dose phosphorous (i.e. 1–4 E15 atoms/cm²) implant into the source, 52, and drain, 54, regions of the ESD transistor is performed by first masking all areas except the pull-down (ESD) transistor, then performing the heavy dose implant, and subsequently, removing the mask. The application of a heavy-dose implant overwhelms LDD regions 56, either partially (FIG. 2c) or completely (FIG. 2d).

A problem with this compromise is that the method requires the addition of separate steps of masking, implanting, and mask stripping to achieve the heavy-dose implant, which increases the expense of production. Furthermore, the stripping of the mask after the heavy-dose implant is more difficult and increases the potential contamination and degradation of the device. What is needed is a method for producing the desired structure that is less complicated and less susceptible to contamination and degradation.

SUMMARY OF THE INVENTION

In accordance with the present invention, an integrated circuit structure and method for making same is described. In general, a MOSFET which is resistant to ESD is disclosed.

A method for making an integrated circuit in accordance with the present invention comprises fabricating at least one functional MOSFET with a hot electron resistant structure including a lightly doped drain. The method further includes fabricating at least one output MOSFET with an ESD resistant structure including a gate structure without associated spacers. Additionally included is the step of electrically coupling at least one functional MOSFET to at least one output MOSFET.

An integrated circuit structure in accordance with the present invention includes at least one functional MOSFET having a hot electron resistant structure including a LDD drain. Also included in the structure is at least one output MOSFET having an ESD resistant structure, including a gate structure without associated spacers. A mechanism for electrically coupling the functional MOSFET and the output MOSFET together is further included. The functional MOSFET has a structure which includes a gate insulator, a conductive gate region over the gate insulator, spacers along the sidewalls of the gate insulator and conductive gate regions, a pair of LDD regions, and source/drain regions. The output MOSFET has a structure which includes a gate insulator, a conductive gate region over the gate insulator, and source/drain regions.

A further method for making an integrated circuit structure includes the step of creating a plurality of NMOS and PMOS gate structures including at least one NMOS gate structure for an ESD transistor. The method further includes the steps of making a PMOS LDD implant, making an NMOS LDD implant, and then creating spacers on the NMOS and PMOS gate structures The spacers from the NMOS gate structure(s) for the ESD transistor are subsequently removed, and source/drain implants for the NMOS and PMOS gate structures are then made.

The present invention results in an integrated circuit having good ESD hardness in the I/O without the need of an additional heavy-dose implant step. Thus, the problems of contamination and degradation associated with an additional heavy-dose implant step as in the prior art are eliminated. Furthermore, the present invention can be easily incorporated into conventional transistor formation processes.

These and other advantages of the present invention will become apparent upon reading the following detailed descriptions and studying the various figures of the drawings.

DETAILED DESCRIPTION OF THE PREFERRED EMBODIMENTS

Figure 1A:
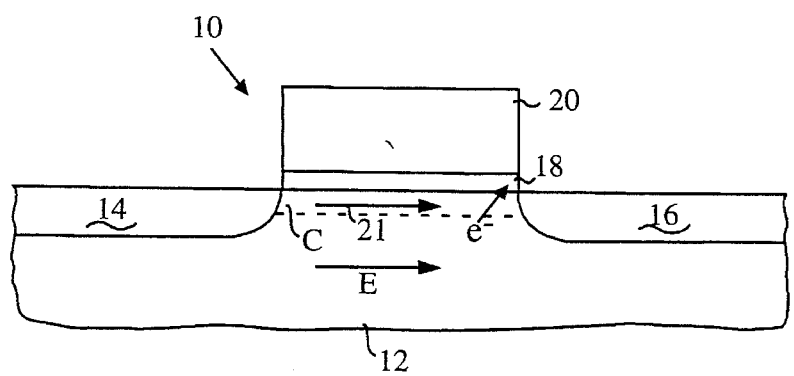
FIG. 1a is a cross-sectional view of an NMOS gate structure.
Figure 1B:
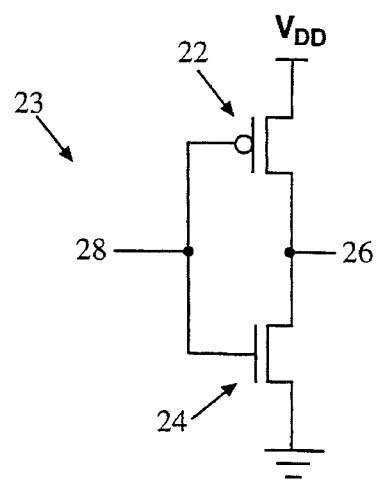
FIG. 1b is a circuit diagram of an invertor.
Figure 1C:
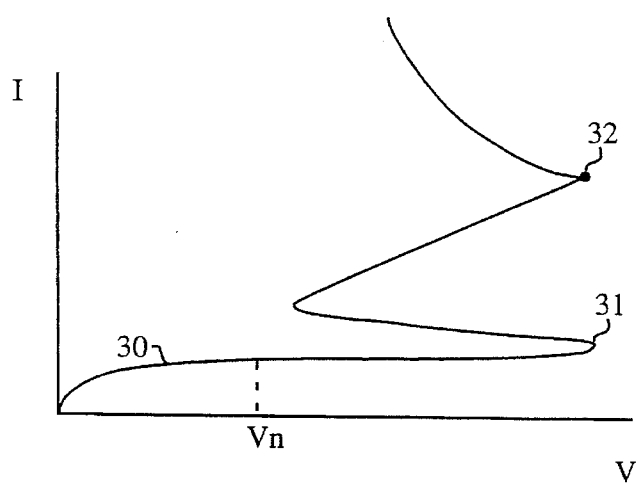
FIG. 1c is a graph of the current-voltage characteristic for a MOSFET illustrating the occurrence of an ESD event.
Figure 2A:
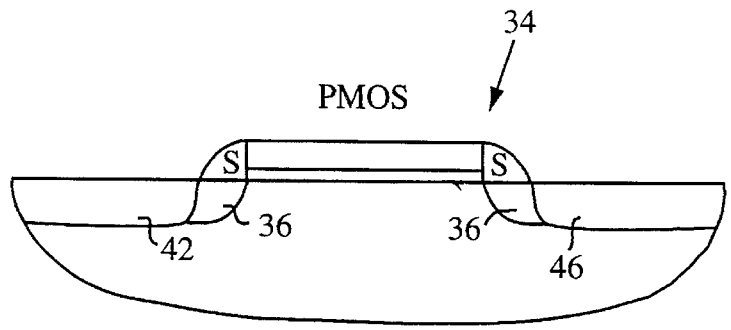
FIG. 2a is a cross-sectional view of a PMOS transistor with a lightly doped drain.
Figure 2B:
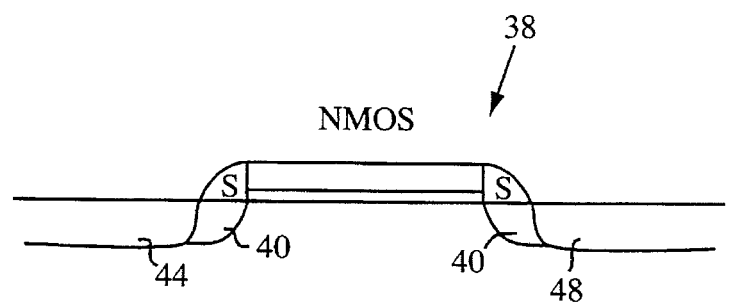
FIG. 2b is a cross-sectional view of an NMOS transistor with a lightly doped drain.
Figure 2C:
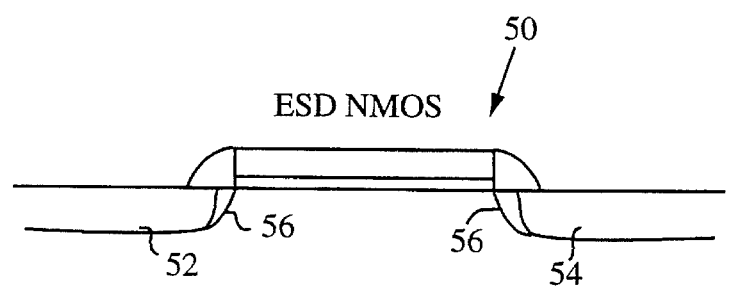
FIG. 2c is a cross-sectional view of an NMOS ESD transistor with a lightly doped drain.
Figure 2D:
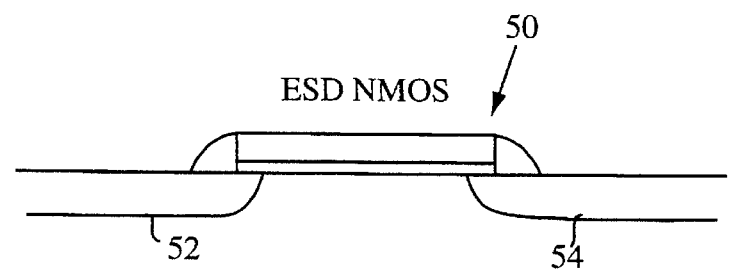
FIG. 2d is a cross-sectional view of an NMOS ESD transistor without a lightly doped drain.
Figure 3:
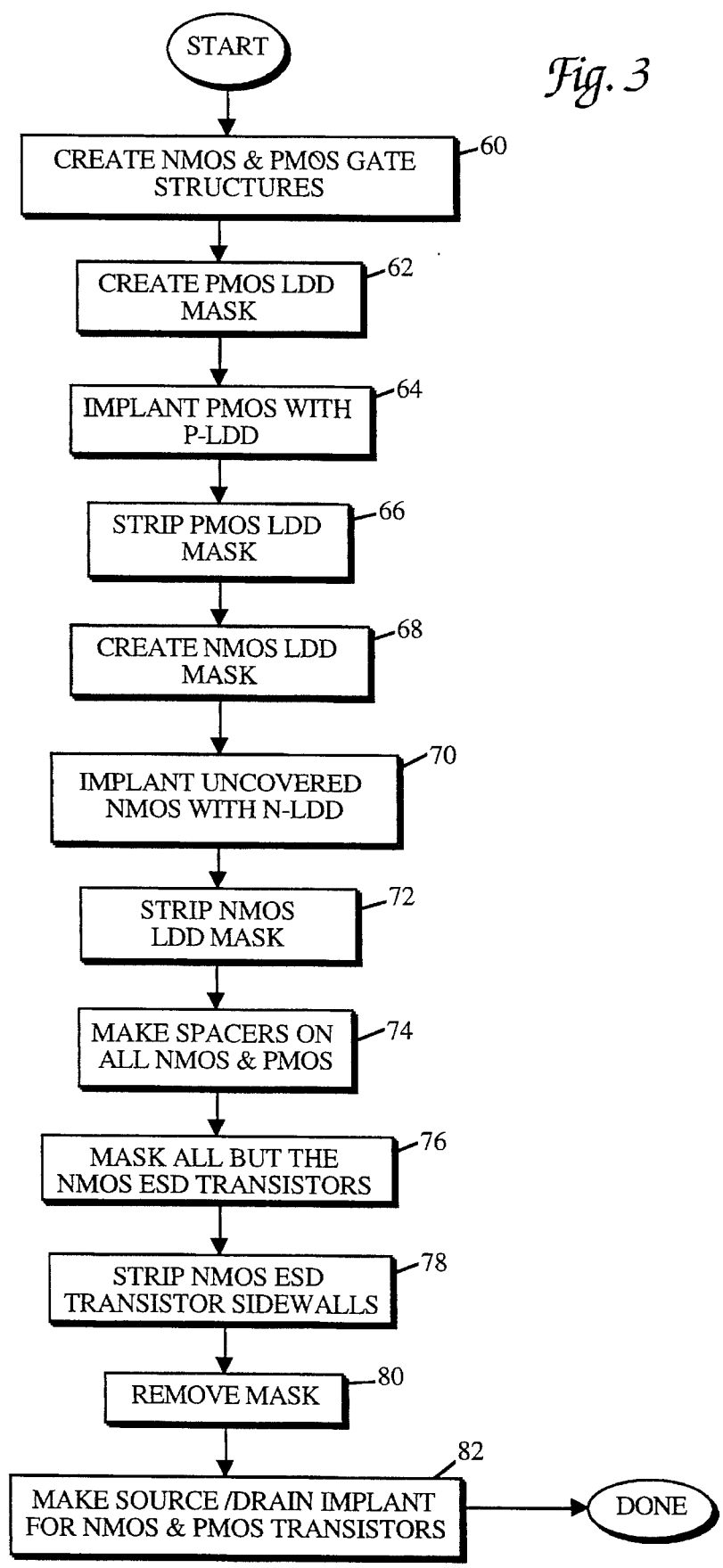
FIG. 3 is a flow diagram for a process for forming MOSFETs in accordance with the present invention.

FIGS. 1a–c and 2a–d were described previously in terms of the prior art. FIG. 3 is a flow diagram of a method in accordance with the present invention. The process begins in step 60 with the creation of NMOS and PMOS gate structures over a semiconductor substrate. The semiconductor substrate is preferably a silicon wafer, or the like, and is preferably lightly P doped. As used herein "substrate" does not necessarily refer to the entire silicon wafer, and may refer to only a portion of the wafer which serves as a substrate for the MOSFET device of the present invention. For example, the substrate can be a P-channel well provided in a neutral or N-channel wafer. The gate structures are preferably produced in step 60 by conventional techniques. For example, a layer of insulating material, typically silicon dioxide ($SiO_2$), is first deposited over a semiconductor substrate, such as by chemical vapor deposition (CVD) or thermal oxidation. Polysilicon gate material is then deposited by a suitable technique such as CVD. The layers are then preferably patterned by standard photolithography techniques to form conductive gate regions and corresponding gate insulator regions. Following the creation of these regions, the next step is to form the PMOS lightly doped drain (LDD) regions. This is suitably accomplished in step 62 by standard techniques of masking all of the gate structures except for the PMOS gate structures with photoresist, and then in step 64, implanting a p-type dopant, such as $BF_2$, into the substrate preferably at an implant density of $2\,E^{13}$ atoms/cm$^2$ and an energy of 60 keV to form the PMOS LDD regions. The mask covering all but the PMOS gate structures is then removed in step 66, such as by wet resist stripping.

Similar to the PMOS LDD region formation is the NMOS LDD regions formation. This formation involves first masking all of the PMOS gate structures in step 68, with photoresist being a suitable mask, and then performing in step 70 an NMOS LDD implant for the uncovered NMOS structures. By way of example, an n-type dopant, such as phosphorous or arsenic implanted at an implant density of about $5\times10^{12}$–$4\times10^{13}$ atoms/cm$^2$ at an energy of about 40–150 keV has been found to work well in forming the NMOS LDD regions. Following the implant, the NMOS LDD mask is then removed in step 72.

In an alternate embodiment, the NMOS gate structures that are designated as ESD NMOS gate structures are masked along with the PMOS gate structures in step 68, since they do not require LDD regions to be formed in step 70. Further, the order of PMOS and NMOS LDD formation is not restricted to that described and can be alternated as desired.

Following the LDD region formation, spacers are formed along the sidewalls of all the NMOS and PMOS gate structures in step 74. This step involves a blanket layer deposition of insulating material, such as by CVD. The insulating material is preferably silicon nitride ($Si_3N_4$), although silicon dioxide is also suitable. An ansiotropic etch, such as a reactive ion etch (RIE), is then performed to remove the insulating material everywhere except along the sidewalls of the gate structures, thus forming the spacers.

Following the formation of the spacers, the non-NMOS ESD gate structures and spacers are masked in step 76, leaving the NMOS ESD gate structures exposed, which is further illustrated and described with reference to FIG. 4a. By way of example, the mask used in the prior art method of heavy-dose ESD implant, as described with reference to FIGS. 2c and 2d, would be suitable for this masking step. An isotropic etch is then performed, as is well known to those skilled in the art, to remove the spacers from the NMOS ESD gate structures in step 78, which is shown in more detail with reference to FIG. 4a. The use of silicon nitride as the insulating material in step 74 for the spacers aids in reducing the possibility of undercutting of the silicon dioxide gate insulator during the spacer etching of step 78.

Once the spacer removal is completed, the mask is removed by standard techniques in step 80. Next, in step 82, the source and drain implants are made to complete the formation of the transistors. During the NMOS source/drain implants, the PMOS gate structures are masked off, and conversely, during the PMOS source/drain implants, the NMOS gate structures are masked off, as is well known to those skilled in the art. By way of example, for the NMOS source/drain implants, an n-type dopant such as arsenic implanted at an implant density of $1-5 \times 10^{15}$ atoms/cm$^2$ and an energy of 20–50 keV has been found to work well. The overall resulting transistor formed is described in more detail with reference to FIG. 5. Once the transistor structures are completed, the electrical coupling of input, output, and core transistors is then performed to create the desired integrated circuits, by metal routing, for example, as is well known to those skilled in the art.

Figure 4A:
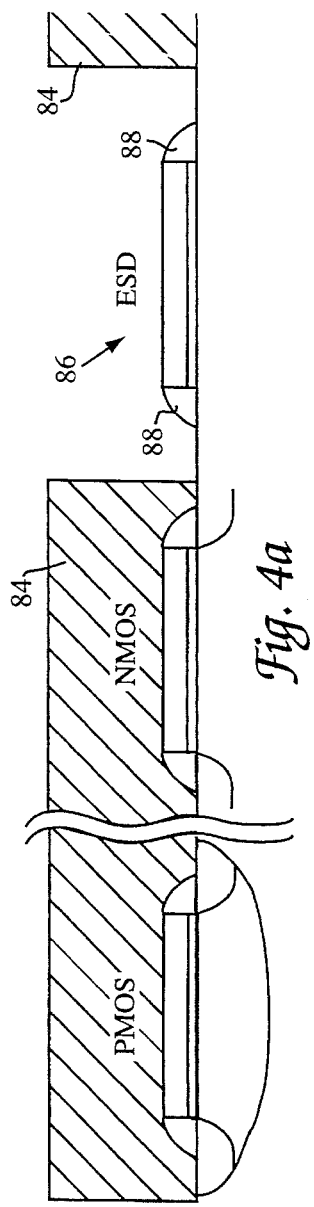
FIG. 4a is a cross-sectional view of a PMOS, NMOS, and NMOS ESD structure during a masking step of the present invention.

FIG. 4a illustrates step 76 of FIG. 3 in which a mask is used to isolate the NMOS ESD gate structures. As shown, a mask 84 covers the PMOS and NMOS gate structures, while the NMOS ESD gate structure(s) 86 are uncovered. In this illustration, the NMOS ESD gate structures 86 do not have associated LDD regions indicating that they were masked during the NMOS LDD implant (step 68 of FIG. 3). The isolation of the ESD gate structures, as illustrated, allows the spacers 88 along the sidewalls to be removed during the spacer etch (step 78 of FIG. 3).

Figure 4B:
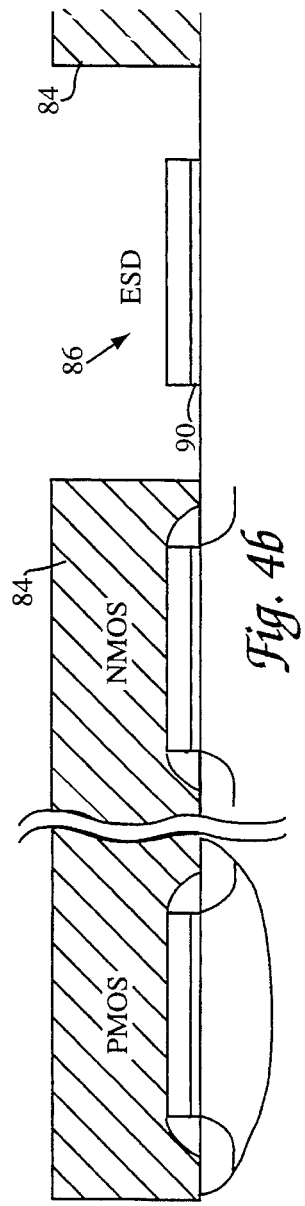
FIG. 4b is a cross-sectional view of a PMOS, NMOS, and NMOS ESD structure after an etching step of the present invention.

FIG. 4b illustrates the NMOS ESD gate structures 86 following the spacer etch (step 78 of FIG. 3). As shown, the spacers 88 are completely removed. As mentioned previously, the use of an insulating material such as silicon nitride rather than silicon dioxide for the spacers reduces the problem of undercutting the gate insulator layer 90 (formed in step 60 of FIG. 3) in the NMOS ESD gate structures, so that the sidewall profile is maintained. Following the spacer removal, the mask 84 is removed, and the transistor formation is completed (step 82 of FIG. 3).

Figure 5:
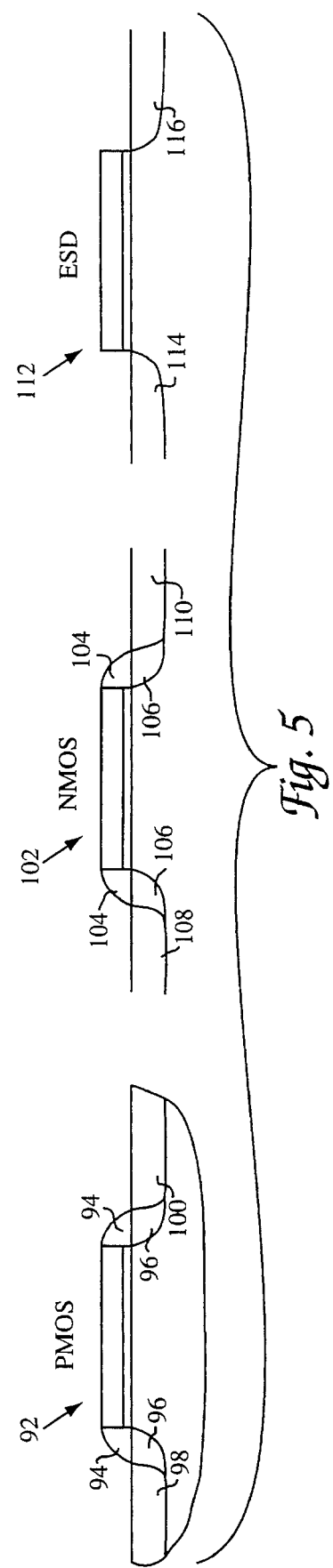
FIG. 5 is a cross-sectional view of a PMOS, NMOS, and NMOS ESD structure produced by the method of the present invention.

FIG. 5 illustrates a cross-sectional view of PMOS, NMOS, and NMOS ESD transistor structures resulting from the process of FIG. 3. As shown, the PMOS transistors have gate structures 92, spacers 94, LDD regions 96, and source/drain regions 98, 100. Similarly, the NMOS transistors have gate structures 102, spacers 104, LDD regions 106, and source/drain regions 108, 110. The NMOS ESD transistors have gate structures 112 and source/drain regions 114, 116, however, they do not have spacers or LDD regions. The lack of LDD regions for the NMOS ESD transistors is the same for the embodiment in which the NMOS ESD gate structures are not masked during the NMOS LDD implant. The lack of the LDD regions in the final structure of these transistors results from the destruction of the LDD regions due to the overwhelming source/drain implanting. Further, since the spacers have been removed from the NMOS ESD transistors, a conventional non-drain-engineered, single-drain n-channel transistor structure is formed for the pull-down transistors in the I/O. At the same time, LDD NMOS transistors are present in the core. Similar non-drain-engineered, single-drain p-channel transistors could also be formed for the pull-up transistors in the I/O by removing the sidewall spacers from the appropriate PMOS gate structures during the same step of removing the sidewall spacers from the NMOS ESD gate structures. However, these p-channel transistors would need to be designed to satisfy other requirements such as punch-through, as will be appreciated by those skilled in the art. The formation of a conventional, i.e. non-drain engineered, transistor for the I/O achieves the desired ESD hardness in the FO, while maintaining LDD structured transistors in the core for other considerations.

While this invention has been described in terms of several preferred embodiments, there are alterations, permutations, and equivalents which fall within the scope of this invention. It is therefore intended that the following appended claims be interpreted as including all such alterations, permutations, and equivalents as fall within the true spirit and scope of the present invention.

What is claimed is:

1. A method for making an integrated circuit structure comprising the steps of:

fabricating at least one functional MOSFET over a semiconductor substrate including a lightly doped drain (LDD) region;

fabricating at least one output MOSFET over said semiconductor substrate including a gate means without associated spacers; and electrically coupling said at least one functional MOSFET transistor to said at least one output MOSFET; wherein said step of fabricating at least one functional MOSFET comprises forming a gate structure over said semiconductor substrate, and said step of fabricating at least one output MOSFET comprises forming said gate means over said semiconductor substrate; and wherein the method further includes a step of simultaneously forming spacers along sidewalls of said gate structure of said at least one functional MOSFET and along sidewalls of said gate means of said at least one output MOSFET, and the method further includes a step of selectively removing the spacers from the sidewalls of said gate means of said at least one output MOSFET thereby to form said gate means of said at least one output MOSFET over said semiconductor substrate without associated spacers while said gate structure of said at least one functional MOSFET is left with the spacers at the sidewalls thereof after said step of selectively removing the spacers, and wherein the method further includes a step of implanting said semiconductor substrate with a dopant while said at least one functional MOSFET with said gate structure having spacers and said at least one output MOSFET with said gate means without associated spacers are both unmasked thereby to simultaneously form source and drain regions of said at least one functional MOSFET and of said at least one output MOSFET during said implanting step.

2. A method for making an integrated circuit structure as recited in claim 1 wherein said step of fabricating at least one functional MOSFET further comprises:

implanting said semiconductor substrate with a light dopant after said step of forming a gate structure and before said step of forming spacers along sidewalls of said gate structure thereby to form said LDD region.

3. A method for making an integrated circuit structure as recited in claim 2 wherein said step of implanting with a light dopant comprises implanting phosphorous into said semiconductor substrate at an energy in about a range of 40 to 150 keV and an implant density in about a range of $5 \times 10^{12}$ to $4 \times 10^{13}$ atoms/cm$^2$.

4. A method for making an integrated circuit structure as recited in claim 1 wherein said step of implanting said semiconductor with a dopant comprises implanting arsenic into said semiconductor substrate at an energy in a range of 20 to 50 keV and an implant density of 1 to $5 \times 10^{15}$ atoms/cm$^2$.

5. A method for making an integrated circuit structure as recited in claim 1 comprising:

depositing a layer of insulating material over said semiconductor substrate;

patterning said layer to simultaneously form said spacers along said sidewalls of said gate structure of said at least one functional MOSFET and to form spacers along sidewalls of said gate means of said at least one output MOSFET; and removing the spacers, by means of selective etching, from the sidewalls of said gate means of said at least one output MOSFET thereby to form said gate means of said at least one output MOSFET over said semiconductor substrate without associated spacers.

6. A method for making an integrated circuit structure as recited in claim 5 wherein said insulating material comprises silicon dioxide ($SiO_2$).

7. A method for making an integrated circuit structure as recited in claim 5 wherein said insulating material comprises silicon nitride ($Si_3N_4$).

8. A method for making an integrated circuit structure as recited in claim 1 wherein said step of implanting said semiconductor substrate with a dopant forms said source and drain regions without a LDD region.

9. A method for making an integrated circuit structure as recited in claim 8 wherein said step of implanting to form said source and drain regions comprises implanting arsenic into said semiconductor substrate at an energy in about a range of 20 to 50 keV and an implant density in about a range of 1 to $5 \times 10^{15}$ atoms/cm$^2$.

10. A method for making an integrated circuit structure as recited in claim 1 wherein said dopant is an n-type dopant.

11. A method for making an integrated circuit structure as recited in claim 1 wherein said dopant is an p-type dopant.

12. A method for making an integrated circuit structure comprising the steps of:

creating a plurality of NMOS and PMOS gate structures over a semiconductor substrate including at least one NMOS gate structure for an ESD transistor;

making a LDD PMOS implant by forming LDD regions of p-type dopant in said semiconductor substrate under said PMOS gate structures;

making a LDD NMOS implant by forming LDD regions of n-type dopant in said semiconductor substrate under said NMOS gate structures;

creating spacers at sidewalls of said NMOS and PMOS gate structures;

removing spacers from said at least one NMOS gate structure for an ESD transistor; and making source and drain implants of n-type dopant and of p-type dopant respectively for said NMOS and PMOS gate structures including said at least one NMOS gate structure for an ESD transistor, said making source and drain implants for said at least one NMOS gate structure for an ESD transistor being performed after said steps of creating spacers at sidewalls of said NMOS and PMOS gate structures and of removing spacers from said at least one NMOS gate structure for an ESD transistor.

13. A method for making an integrated circuit structure as recited in claim 12 wherein said step of making a LDD PMOS implant comprises masking said NMOS gate structures, implanting said semiconductor substrate with said p-type dopant, and removing said masking.

14. A method for making an integrated circuit structure as recited in claim 12 wherein said step of making a LDD NMOS implant comprises masking said PMOS gate structures and said at least one NMOS gate structure for an ESD transistor, implanting said semiconductor substrate with said n-type dopant, and removing said masking.

15. A method for making an integrated circuit structure as recited in claim 12 wherein said step of creating spacers comprises depositing a layer of insulating material over said semiconductor substrate and said PMOS and NMOS gate structures, and patterning said insulating material to form said spacers.

16. A method for making an integrated circuit structure as recited in claim 15 wherein said step of removing spacers comprises masking said NMOS and PMOS gate structures without masking said at least one NMOS gate structure for an ESD transistor, and etching said spacers from said at least one NMOS gate structure for an ESD transistor.

17. A method for making an integrated circuit structure as recited in claim 12 wherein said step of making source/drain implants comprises masking said PMOS gate structures, implanting said semiconductor substrate with said n-type dopant, and removing said masking.

18. A method for making an integrated circuit structure as recited in claim 17 wherein said n-type dopant comprises arsenic implanted at an implant density of about $1-5 \times 10^{15}$ atoms/cm$^2$ and an energy of about 20 to 50 keV.

19. A method for making an integrated circuit structure as recited in claim 16 wherein said insulating material comprises silicon nitride, and wherein said etching step utilizes an etchant which preferentially removes silicon nitride.

20. A method for making an integrated circuit structure as recited in claim 15 wherein said insulating material comprises silicon dioxide.

21. A method for making an integrated circuit structure as recited in claim 14 wherein said n-type dopant comprises phosphorous implanted at an implant density of about $5 \times 10^{12} - 4 \times 10^{13}$ atoms/cm$^2$ and an energy of about 40 to 150 keV.

22. A method for making an integrated circuit structure as recited in 12 wherein said step of making source/drain implants comprises masking said NMOS gate structures and said at least one NMOS gate structure for an ESD transistor, implanting said semiconductor substrate with said p-type dopant, and removing said masking.

* * * * *